(12) United States Patent
Barad et al.

(10) Patent No.: US 11,562,200 B2
(45) Date of Patent: Jan. 24, 2023

(54) DEEP LEARNING INFERENCE EFFICIENCY TECHNOLOGY WITH EARLY EXIT AND SPECULATIVE EXECUTION

(71) Applicant: Intel Corporation, Santa Clara, CA (US)

(72) Inventors: Haim Barad, Zichron Yaakov (IL); Barak Hurwitz, Kibbutz Alonim (IL); Uzi Sarel, Zichron-Yaakov (IL); Eran Geva, Haifa (IL); Eli Kfir, Yakir (IL); Moshe Island, Tel Mond (IL)

(73) Assignee: Intel Corporation, Santa Clara, CA (US)

( * ) Notice: Subject to any disclaimer, the term of this patent is extended or adjusted under 35 U.S.C. 154(b) by 1026 days.

(21) Appl. No.: 16/266,880

(22) Filed: Feb. 4, 2019

(65) Prior Publication Data

US 2019/0180168 A1   Jun. 13, 2019

(51) Int. Cl.
*G06N 3/04* (2006.01)
*G06F 30/33* (2020.01)

(52) U.S. Cl.
CPC ............... *G06N 3/04* (2013.01); *G06F 30/33* (2020.01)

(58) Field of Classification Search
None
See application file for complete search history.

(56) References Cited

U.S. PATENT DOCUMENTS

| | | | |
|---|---|---|---|
| 2018/0165578 A1* | 6/2018 | Chung | G06N 3/0481 |
| 2019/0138890 A1* | 5/2019 | Liang | G06N 3/0445 |
| 2020/0079320 A1* | 3/2020 | Lacoss-Arnold | B60R 25/2081 |

OTHER PUBLICATIONS

Teerapittayanon, S., McDanel, B., & Kung, H. T. (Dec. 2016). Branchynet: Fast inference via early exiting from deep neural networks. In 2016 23rd International Conference on Pattern Recognition (ICPR) (pp. 2464-2469). IEEE. (Year: 2016).*
Panda, P., Sengupta, A., & Roy, K. (Mar. 2016). Conditional deep learning for energy-efficient and enhanced pattern recognition. In 2016 Design, Automation & Test in Europe Conference & Exhibition (DATE) (pp. 475-480). IEEE. (Year: 2016).*
Barad, "Fast Inference with Early Exit", Intel AI, Jan. 10, 2019, 10 pages.
S. Teerapittayanon et al., "Distributed Deep Neural Networks over the Cloud, the Edge, and End Devices", 2017 IEEE 37th International Conference on Distributed Computing Systems, Jun. 8, 2017, 12 pages.

\* cited by examiner

*Primary Examiner* — David Perlman
(74) *Attorney, Agent, or Firm* — Jordan IP Law, LLC

(57) ABSTRACT

Systems, apparatuses and methods may provide for technology that processes an inference workload in a first subset of layers of a neural network that prevents or inhibits data dependent branch operations, conducts an exit determination as to whether an output of the first subset of layers satisfies one or more exit criteria, and selectively bypasses processing of the output in a second subset of layers of the neural network based on the exit determination. The technology may also speculatively initiate the processing of the output in the second subset of layers while the exit determination is pending. Additionally, when the inference workloads include a plurality of batches, the technology may mask one or more of the plurality of batches from processing in the second subset of layers.

24 Claims, 3 Drawing Sheets

DEEP LEARNING INFERENCE EFFICIENCY TECHNOLOGY WITH EARLY EXIT AND SPECULATIVE EXECUTION

TECHNICAL FIELD

Embodiments generally relate to machine learning technology. More particularly, embodiments relate to deep learning efficiency technology with early exit and speculative execution.

BACKGROUND

In machine learning, hardware accelerators (e.g., field programmable gate arrays/FPGAs, application specific integrated circuits/ASICs) may be used to implement deep neural networks (DNNs) that classify unknown input data (e.g., images, natural language) based on real-time inferences. Deep neural networks typically contain several intermediate layers positioned between an input layer and an output layer. Any ability to exit the DNN early may be limited in accelerator-based solutions because the hardware prevents or inhibits data dependent branch operations. Accordingly, processing may traverse all of the layers of the accelerator-based DNN in every instance, which increases latency, reduces performance and/or increases power consumption.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Figure 1:
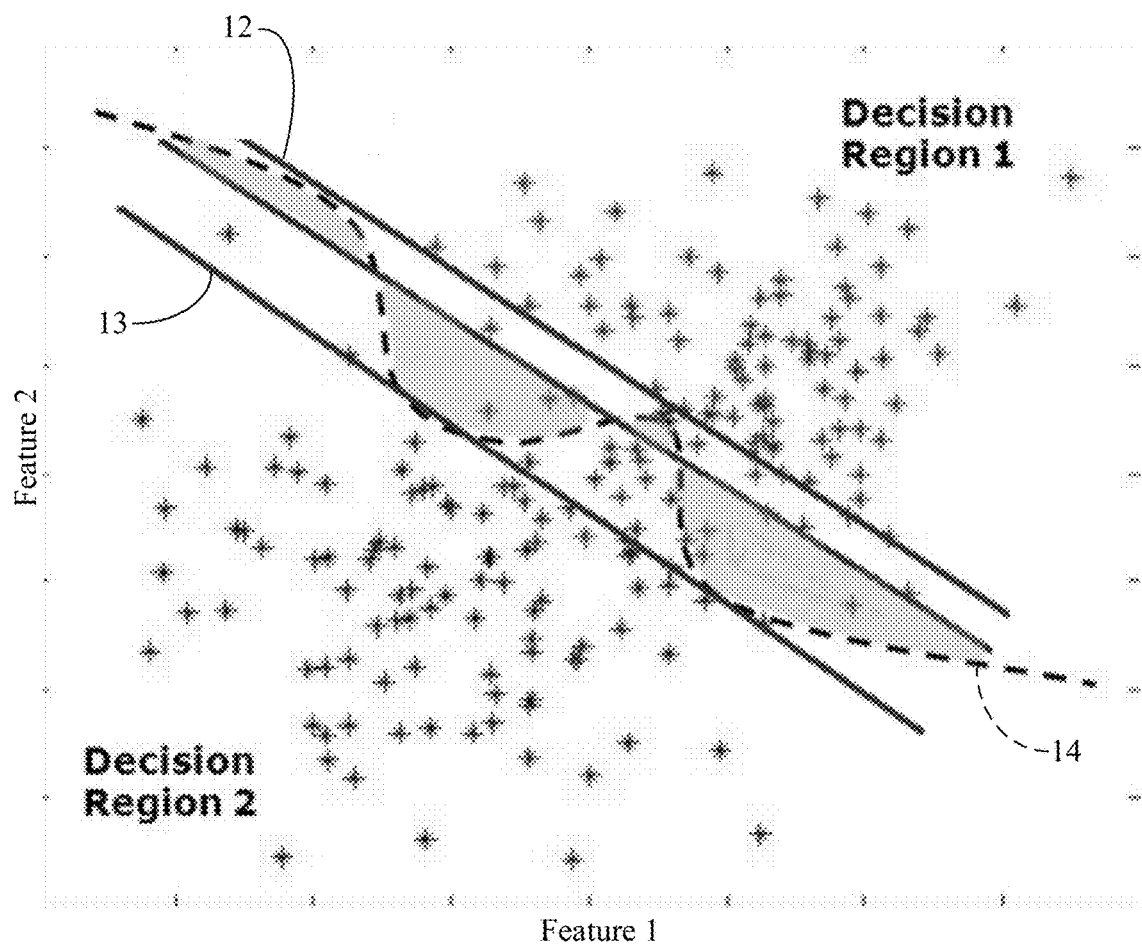
FIG. 1 is an illustration of an example of a decision boundary according to an embodiment.

Turning now to FIG. 1, a two-dimensional (2D) feature space 10 is shown in which a first feature ("Feature 1") and a second feature ("Feature 2") are used to determine whether input data is located in a first decision region ("Decision Region 1," e.g., a first class) or a second decision region ("Decision Region 2," e.g., a second class). In the illustrated example, a decision boundary 14 between the two decision regions is expressed by fully traversing a deep neural network (DNN), wherein the distance of a data point from the boundary 14 is generally a measure of confidence that the data point was properly classified. As will be discussed in greater detail, data points that are relatively close to the boundary 14 may benefit from full traversal of the DNN, whereas data points that are relatively far away from the boundary 14 may trigger an early exit from the DNN without concern over a lack of accuracy. For example, points between a first simplified boundary 12 and a second simplified boundary 13 may be more suitable for full traversal of the DNN, whereas points outside the first simplified boundary 12 and the second simplified boundary 13 may be used to exit the DNN early.

Indeed, early exit strategies may be used to test classification confidence at different locations along the more accurate decision boundary 14 of the DNN and determine if an earlier classification has a high enough confidence to terminate work for that data point with the classification prediction at that stage/layer. Accordingly, exit criteria such as, for example, the ratio of data that is relatively far away from the decision boundary 14 to data that is relatively close to the decision boundary 14, may be used to selectively bypass subsequent layers of the DNN. Exiting the neural network early may significantly enhance performance (e.g., decrease latency) and/or reduce power consumption (e.g., by deactivating bypassed layers). Although an orthogonal 2D feature space 10 is shown, non-orthogonal and/or n-dimensional configurations may also be used.

Figure 2:
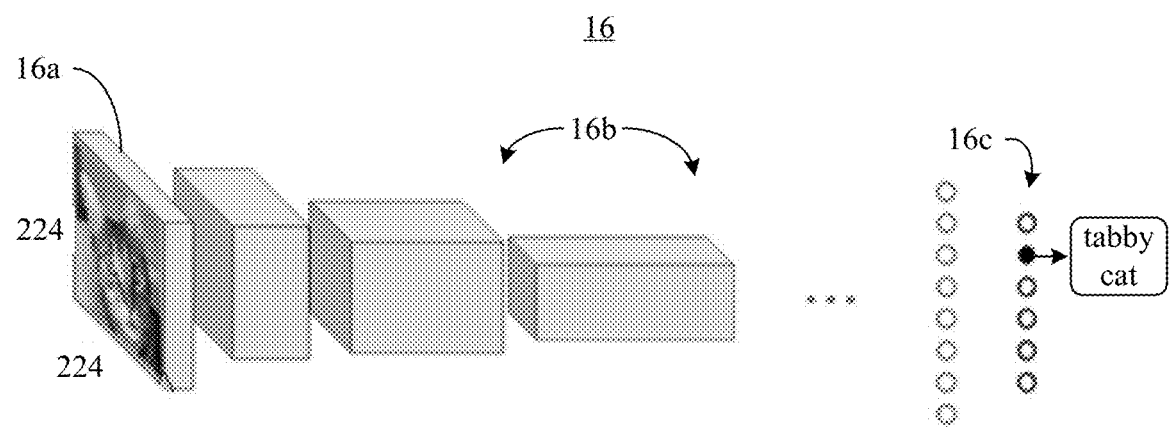
FIG. 2 is an illustration of an example of a neural network according to an embodiment.

FIG. 2 shows a neural network 16 (16a-16c) that includes an input layer 16a, a plurality of intermediate layers 16b, and an output layer 16c. In an embodiment, the neural network 16 is implemented on one or more accelerators and prevents or inhibits data dependent branch operations. In the illustrated example, an unknown image (e.g., a cat) is provided to the input layer 16a, which might execute on an edge computing component (e.g., Internet of Things/IoT device, vehicle, etc.). In a full end-to-end embodiment, the intermediate layers 16b and the output layer 16c execute on a cloud computing infrastructure having relatively high compute capacity. Exiting the neural network 16 after the input layer 16a may enable significant latency savings associated with avoiding traversal of the cloud computing infrastructure. In an embodiment, the latency savings enhance performance and/or reduce power consumption. In another embodiment, the entire network 16 is contained in a single, localized device where the latency savings may not be as extreme, but still very beneficial.

Figure 3:
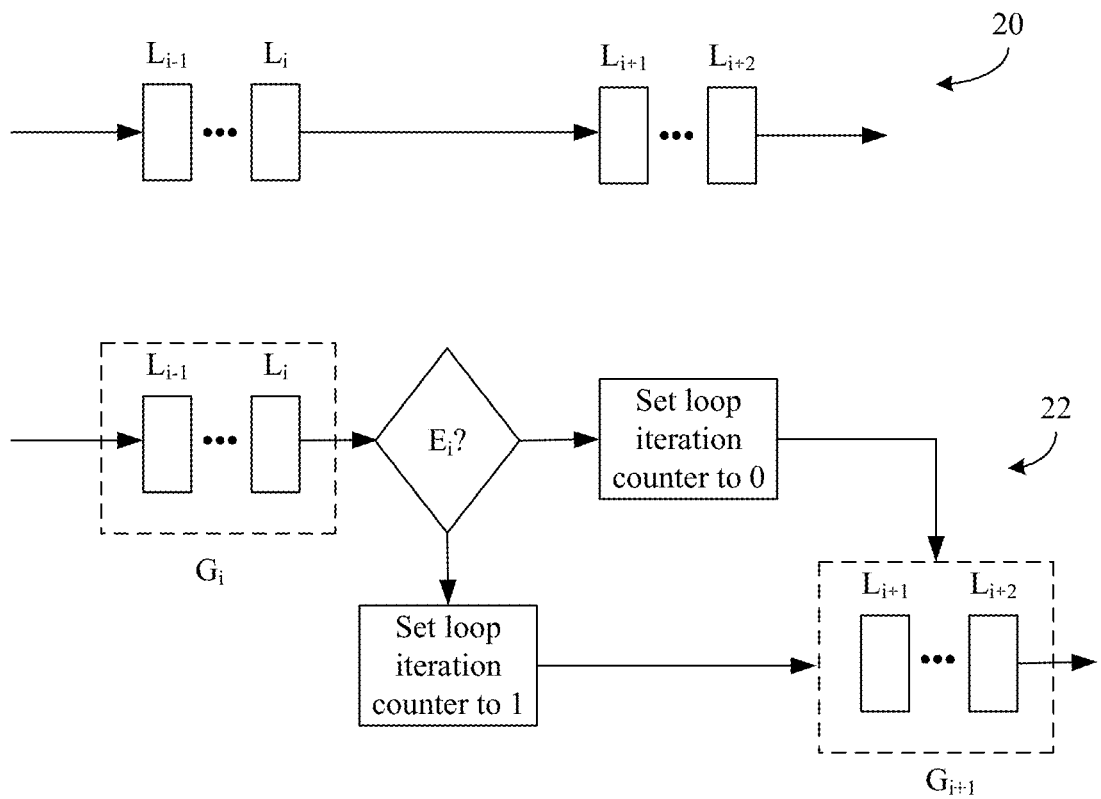
FIG. 3 is a comparative block diagram of a conventional model of a deep neural network and an enhanced model of a deep neural network according to an embodiment.

FIG. 3 shows a conventional model 20 (e.g., graph) of a neural network such as, for example, the neural network 16 (FIG. 2) and an enhanced model 22 (e.g., graph) of a neural network such as, for example, the neural network 16 (FIG. 2). In the conventional model 20, the layers of the neural network are arranged as $L_{i-1}$, $L_i$, $L_{i+1}$, $L_{i+2}$, etc., with no intervening components. In the enhanced model 22, a first subset $G_i$ of layers $L_{i-1}$, $L_i$ is connected to an exit intermediary $E_i$, which determines whether the output of the first subset $G_i$ of layers satisfies one or more exit criteria. If so, the illustrated exit intermediary $E_i$ clears a loop iteration counter associated with a second subset $G_{i+1}$ of layers $L_{i+1}$, $L_{i+2}$, ..., by setting the loop iteration counter to zero. In an embodiment, clearing the loop iteration counter prevents the second subset $G_{i+1}$ and all following layers from being executed. If the exit criteria are not satisfied, the exit intermediary $E_i$ sets the loop iteration counter (e.g., to a value of one), which permits the second subset $G_{i+1}$ to be executed. In one example, the first subset $G_i$ of layers is executed on a common execution unit to enhance efficiency and/or throughput.

In an embodiment, the placement of the exit intermediary $E_i$ is determined based on memory hierarchy boundaries. For example, the exit intermediary $E_i$ might be inserted after a layer that is expected to fill a last level cache (LLC) on a processor. Such an approach may enable performance benefits to be achieved by reducing input/output (IO) traffic associated with accessing off-chip memory or storage.

Moreover, multiple exit intermediaries $E_i$ may be added to the accelerator-based neural network architecture depending on the circumstances. Other exit placement heuristics may also be used.

Figure 4:
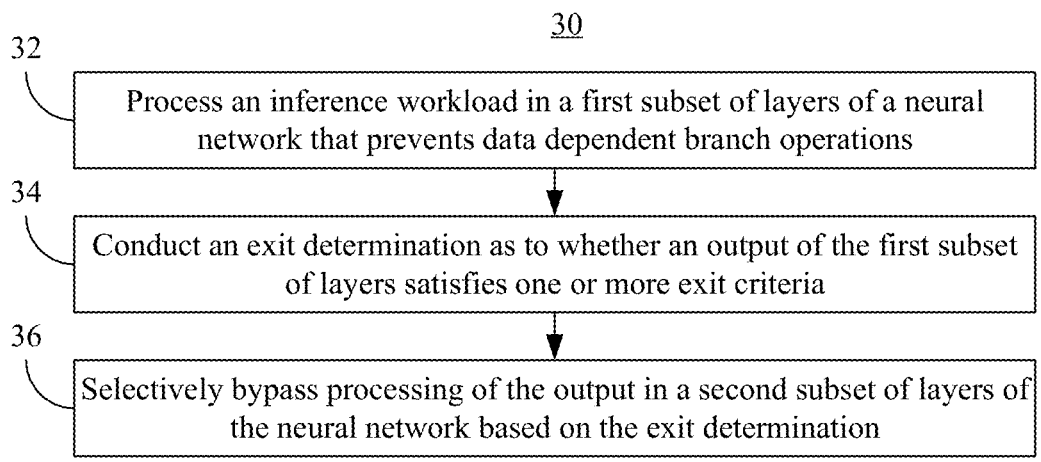
FIG. 4 is a flowchart of an example of a method of operating a computing system according to an embodiment.

FIG. 4 shows a method 30 of operating a computing system. The method 30 may be implemented in one or more modules as configurable logic such as, for example, programmable logic arrays (PLAs), field programmable gate arrays (FPGAs), complex programmable logic devices (CPLDs), in fixed-functionality logic hardware using circuit technology such as, for example, application specific integrated circuit (ASIC), complementary metal oxide semiconductor (CMOS) or transistor-transistor logic (TTL) technology, or any combination thereof.

Illustrated processing block 32 processes an inference workload in a first subset of layers of a neural network that prevents data dependent branch operations (e.g., software-based IF, THEN, ELSE operations). In an embodiment, the inference workload includes unknown input data such as, for example, images, natural language data, and so forth. Moreover, block 32 may include executing the first subset of layers on a common execution unit (e.g., of an edge network component). An exit determination may be conducted at block 34 as to whether an output of the first subset of layers satisfies one or more exit criteria. In one example, the one or more exit criteria includes a ratio of data that is relatively far away from a decision boundary to data that is relatively close to the decision boundary. Block 36 selectively bypasses processing of the output of the first subset of layers in a second subset of layers of the neural network based on the exit determination.

In an embodiment, block 36 includes clearing a loop iteration counter associated with the second subset of layers if the output satisfies the one or more exit criteria. Additionally, block 36 may include setting the loop iteration counter if the output does not satisfy the one or more exit criteria.

Block 34 may include speculatively initiating a processing of the output in a second subset of layers of the neural network while the exit determination is pending. In such a case, if it is subsequently determined that the output of the first subset of layers does not satisfy the one or more exit criteria, execution proceeds as normal and the exit determination has no impact on overall latency. By contrast, if it is determined that the output of the first subset of layers satisfies the exit criteria, block 36 might flush data from the second subset of layers. Thus, while the speculative execution may occur at the expense of some partially executed graphs being flushed, the overhead can be completely masked due to the successful early exits described herein.

In another example, the inference workload includes a plurality of batches (e.g., multiple images). In such a case, block 36 includes masking one or more of the plurality of batches from processing in the second subset of layers. Thus, if three out of twelve images exit early, the three images exiting early may be masked from execution, while the remaining nine images are unmasked and continue progressing through the neural network. More particularly, the handling of multiple inputs in parallel may be conducted using vectorized code. Thus, each computation in a vector of computations is done with a mask indicting the active lane of execution. An approach to handling divergence in control (e.g., instead of or in conjunction with masked execution) is to collect the active lanes and operate only on the active lanes. In such a case, dynamic batch sizes may be supported. The illustrated method 30 therefore significantly enhances performance (e.g., by decreasing latency) and/or reduces power consumption (e.g., by deactivating bypassed layers).

Figure 5:
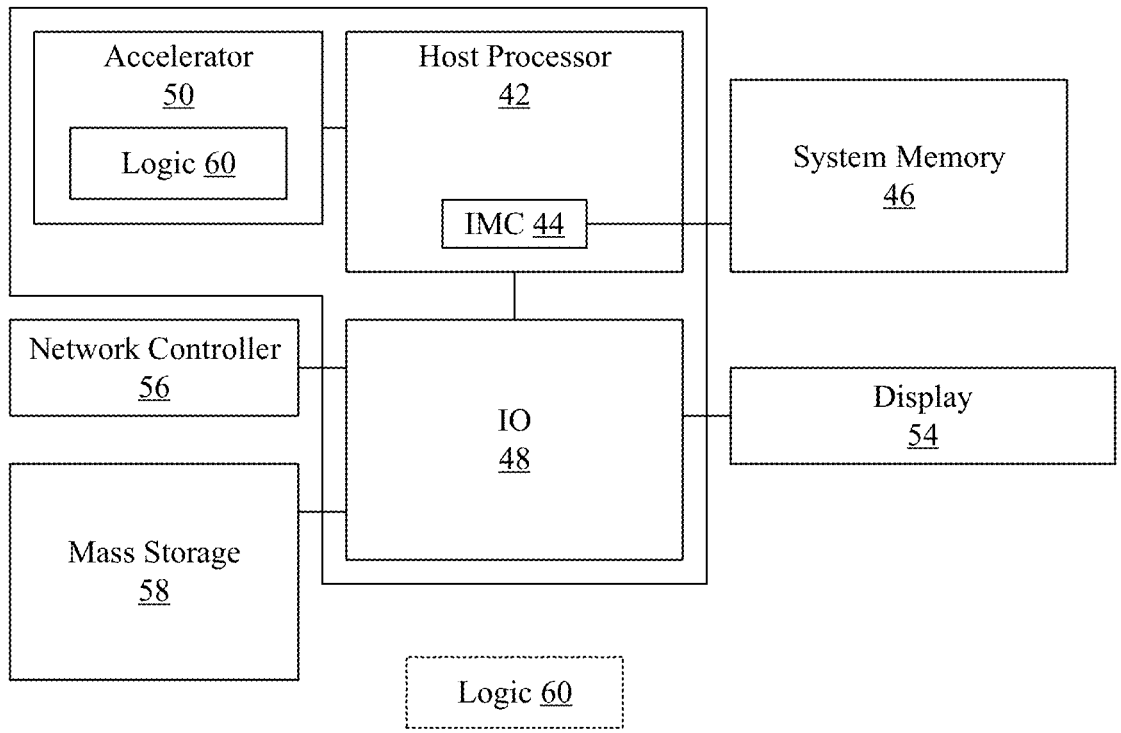
FIG. 5 is a block diagram of an example of a performance-enhanced computing system according to an embodiment.

Turning now to FIG. 5, a performance-enhanced computing system 40 is shown. The computing system 40 may generally be part of an electronic device/platform having computing functionality (e.g., personal digital assistant/PDA, notebook computer, tablet computer, convertible tablet, server), communications functionality (e.g., smart phone), imaging functionality (e.g., camera, camcorder), media playing functionality (e.g., smart television/TV), wearable functionality (e.g., watch, eyewear, headwear, footwear, jewelry), vehicular functionality (e.g., car, truck, motorcycle), gaming functionality (e.g., networked multi-player console), etc., or any combination thereof. In the illustrated example, the system 40 includes a host processor 42 (e.g., central processing unit/CPU) having an integrated memory controller (IMC) 44 that is coupled to a system memory 46.

The illustrated system 40 also includes an input output (IO) module 48 implemented together with the processor 42 and an accelerator 50 (e.g., graphics processor, FPGA, etc.) on a semiconductor die 52 as a system on chip (SoC). The illustrated IO module 48 communicates with, for example, a display 54 (e.g., touch screen, liquid crystal display/LCD, light emitting diode/LED display), a network controller 56 (e.g., wired and/or wireless), and mass storage 58 (e.g., hard disk drive/HDD, optical disk, solid state drive/SSD, flash memory). The network controller 56 may obtain inference workloads from, for example, other remote and/or local computing platforms. In an embodiment, the accelerator 50 includes logic 60 (e.g., configurable logic, fixed-functionality hardware logic, etc., or any combination thereof) to perform one or more aspects of the method 30 (FIG. 4), already discussed.

Thus, the logic 60 may process the inference workloads in a first subset of layers of a neural network that inhibits or prevents data dependent branch operations, conduct an exit determination as to whether an output of the first subset of layers satisfies one or more exit criteria, and selectively bypass processing of the output in a second subset of layers of the neural network based on the exit determination. In an embodiment, the logic 60 speculatively initiates the processing of the output in the second subset of layers while the exit determination is pending. Additionally, when the inference workloads include a plurality of batches, the logic 60 may mask one or more of the plurality of batches from processing in the second subset of layers. Although the logic 60 is shown in the accelerator 50, the logic may alternatively be located elsewhere in the system 40.

Figure 6:
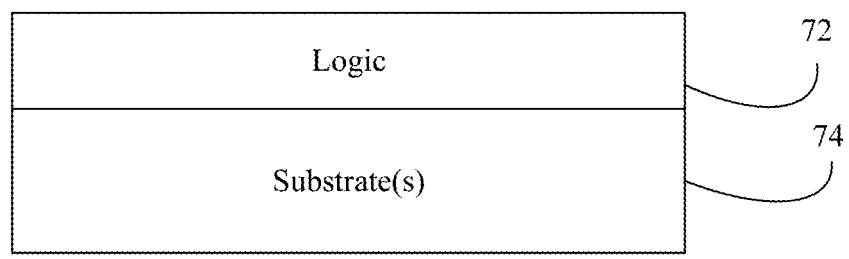
FIG. 6 is an illustration of an example of a semiconductor apparatus according to an embodiment.

FIG. 6 shows a semiconductor package apparatus 70. The illustrated apparatus 70 includes one or more substrates 74 (e.g., silicon, sapphire, gallium arsenide) and logic 72 (e.g., transistor array and other integrated circuit/IC components) coupled to the substrate(s) 74. The logic 72 may be implemented at least partly in configurable logic or fixed-functionality logic hardware. In one example, the logic 72 implements one or more aspects of the method 30 (FIG. 4), already discussed. Thus, the logic 72 processes the inference workloads in a first subset of layers of a neural network that inhibits or prevents data dependent branch operations, conducts an exit determination as to whether an output of the first subset of layers satisfies one or more exit criteria, and selectively bypasses processing of the output in a second subset of layers of the neural network based on the exit determination.

In one example, the logic 72 includes transistor channel regions that are positioned (e.g., embedded) within the substrate(s) 74. Thus, the interface between the logic 72 and the substrate(s) 104 may not be an abrupt junction. The logic 72 may also be considered to include an epitaxial layer that is grown on an initial wafer of the substrate(s) 74.

Additional Notes and Examples

Example 1 includes a semiconductor apparatus comprising one or more substrates and logic coupled to the one or more substrates, wherein the logic is implemented at least partly in one or more of configurable logic or fixed-functionality hardware logic, the logic coupled to the one or more substrates to execute a first subset of layers of a common execution unit, wherein the neural network prevents data dependent branch operations, process an inference workload in the first subset of layers, conduct an exit determination as to whether an output of the first subset of layers satisfies one or more exit criteria, clear a loop iteration counter associated with a second subset of layers of the neural network if the output satisfies the one or more exit criteria, and set the loop iteration counter if the output does not satisfy the one or more exit criteria.

Example 2 includes the semiconductor apparatus of Example 1, wherein the logic coupled to the one or more substrates is to speculatively initiate processing of the output in the second subset of layers while the exit determination is pending.

Example 3 includes the semiconductor apparatus of any one of Examples 1 to 2, wherein the inference workload is to include a plurality of batches and the logic coupled to the one or more substrates is to mask one or more of the plurality of batches from processing in the second subset of layers.

Example 4 includes the semiconductor apparatus of any one of Examples 1 to 2, wherein the one or more exit criteria is to include a ratio of data is relatively far away from a decision boundary to data that is relatively close to the decision boundary.

Example 5 includes a computing system comprising a network controller to obtain an inference workload, and a processor including one or more substrates and logic coupled to the one or more substrates, wherein the logic is implemented at least partly in one or more of configurable logic or fixed-functionality hardware logic, the logic coupled to the one or more substrates to process the inference workload in a first subset of layers of a neural network that prevents data dependent branch operations, conduct an exit determination as to whether an output of the first subset of layers satisfies one or more exit criteria, and selectively bypass processing of the output in a second subset of layers of the neural network based on the exit determination.

Example 6 includes the computing system of Example 5, wherein the logic coupled to the one or more substrates is to clear a loop iteration counter associated with the second subset of layers if the output satisfies the one or more exit criteria.

Example 7 includes the computing system of Example 6, wherein the logic coupled to the one or more substrates is to set the loop iteration counter if the output does not satisfy the one or more exit criteria.

Example 8 includes the computing system of any one of Examples 5 to 7, wherein the logic coupled to the one or more substrates is to speculatively initiate the processing of the output in the second subset of layers while the exit determination is pending.

Example 9 includes the computing system of any one of Examples 5 to 7, wherein the inference workload is to include a plurality of batches and the logic coupled to the one or more substrates is to mask one or more of the plurality of batches from processing in the second subset of layers.

Example 11 includes a semiconductor apparatus comprising one or more substrates, and logic coupled to the one or more substrates, wherein the logic is implemented at least partly in one or more of configurable logic or fixed-functionality hardware logic, the logic coupled to the one or more substrates to process an inference workload in a first subset of layers of a neural network that prevents data dependent branch operations, conduct an exit determination as to whether an output of the first subset of layers satisfies one or more exit criteria, and selectively bypass processing of the output in a second subset of layers of the neural network based on the exit determination.

Example 12 includes the semiconductor apparatus of Example 11, wherein the logic coupled to the one or more substrates is to clear a loop iteration counter associated with the second subset of layers if the output satisfies the one or more exit criteria.

Example 13 includes the semiconductor apparatus of Example 12, wherein the logic coupled to the one or more substrates is to set the loop iteration counter if the output does not satisfy the one or more exit criteria.

Example 14 includes the semiconductor apparatus of any one of Examples 11 to 13, wherein the logic coupled to the one or more substrates is to speculatively initiate the processing of the output in the second subset of layers while the exit determination is pending.

Example 15 includes the semiconductor apparatus of any one of Examples 11 to 13, wherein the inference workload is to include a plurality of batches and the logic coupled to the one or more substrates is to mask one or more of the plurality of batches from processing in the second subset of layers.

Example 16 includes the semiconductor apparatus of Example 11, wherein the one or more exit criteria is to include a ratio of data is relatively far away from a decision boundary to data that is relatively close to the decision boundary.

Example 17 includes the semiconductor apparatus of Example 11, wherein the logic coupled to the one or more substrates is to execute the first subset of layers on a common execution unit.

Example 18 includes the semiconductor apparatus of Example 11, wherein the logic coupled to the one or more substrates includes transistor channel regions that are positioned within the one or more substrates.

Example 19 includes a method comprising processing an inference workload in a first subset of layers of a neural network that prevents data dependent branch operations, conducting an exit determination as to whether an output of the first subset of layers satisfies one or more exit criteria, and selectively bypassing processing of the output in a second subset of layers of the neural network based on the exit determination.

Example 20 includes the method of Example 19, wherein selectively bypassing the processing of the output in the second subset of layers includes clearing a loop iteration counter associated with the second subset of layers if the output satisfies the one or more exit criteria.

Example 21 includes the method of Example 21, wherein selectively bypassing the processing of the output in the second subset of layers includes setting the loop iteration counter if the output does not satisfy the one or more exit criteria.

Example 22 includes the method of any one of Examples 19 to 21, further including speculatively initiating the processing of the output in the second subset of layers while the exit determination is pending.

Example 23 includes the method of any one of Examples 19 to 21, wherein the inference workload includes a plurality of batches and selectively bypassing processing of the output in the second subset of layers includes masking one or more of the plurality of batches from processing in the second subset of layers.

Example 24 includes the method of Example 19, wherein the one or more exit criteria includes a ratio of data that is relatively far away from a decision boundary to data that is relatively close to the decision boundary.

Example 25 includes the method of Example 19, further including executing the first subset of layers on a common execution unit.

Example 26 includes means for performing the method of any one of Examples 19 to 25.

Thus, technology described herein may enable efficient enablement and control over early exit testing and routing of computation flows. The technology is particularly useful in special purpose architectures such as, for example, graphics processors and FPGAs, having deep, fixed pipelines to enhance throughput. Additionally, the technology does not require control by a host processor.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the computing system within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:
1. A semiconductor apparatus comprising:
one or more substrates; and
logic coupled to the one or more substrates, wherein the logic is implemented at least partly in one or more of configurable logic or fixed-functionality hardware logic, the logic coupled to the one or more substrates to:
execute a first subset of layers of a neural network on a common execution unit, wherein the neural network prevents data dependent branch operations;
process an inference workload in the first subset of layers;
conduct an exit determination as to whether an output of the first subset of layers satisfies one or more exit criteria;
initiate an operation to process the output in a second subset of layers of the neural network while the exit determination is pending;
clear a loop iteration counter associated with the second subset of layers if the output satisfies the one or more exit criteria; and
set the loop iteration counter if the output does not satisfy the one or more exit criteria.

2. The semiconductor apparatus of claim 1, wherein the operation is a speculative operation.

3. The semiconductor apparatus of claim 1, wherein the inference workload is to include a plurality of batches and the logic coupled to the one or more substrates is to mask one or more of the plurality of batches from processing in the second subset of layers.

4. The semiconductor apparatus of claim 1, wherein the one or more exit criteria is to include a ratio of data is relatively far away from a decision boundary to data that is relatively close to the decision boundary.

5. A computing system comprising:
a network controller to obtain an inference workload; and
a processor including one or more substrates and logic coupled to the one or more substrates, wherein the logic is implemented at least partly in one or more of configurable logic or fixed-functionality hardware logic, the logic coupled to the one or more substrates to:
process the inference workload in a first subset of layers of a neural network that prevents data dependent branch operations,
conduct an exit determination as to whether an output of the first subset of layers satisfies one or more exit criteria, initiate an operation to process the output in a second subset of layers of the neural network while the exit determination is pending, and selectively bypass processing of the output in the second subset of layers of the neural network based on the exit determination.

6. The computing system of claim 5, wherein the logic coupled to the one or more substrates is to clear a loop iteration counter associated with the second subset of layers if the output satisfies the one or more exit criteria.

7. The computing system of claim 6, wherein the logic coupled to the one or more substrates is to set the loop iteration counter if the output does not satisfy the one or more exit criteria.

8. The computing system of claim 5, wherein the operation is a speculative operation.

9. The computing system of claim 5, wherein the inference workload is to include a plurality of batches and the logic coupled to the one or more substrates is to mask one or more of the plurality of batches from processing in the second subset of layers.

10. A semiconductor apparatus comprising:
one or more substrates; and
logic coupled to the one or more substrates, wherein the logic is implemented at least partly in one or more of configurable logic or fixed-functionality hardware logic, the logic coupled to the one or more substrates to:
process an inference workload in a first subset of layers of a neural network that prevents data dependent branch operations;
conduct an exit determination as to whether an output of the first subset of layers satisfies one or more exit criteria;
initiate an operation to process the output in a second subset of layers of the neural network while the exit determination is pending; and
selectively bypass processing of the output in a second subset of layers of the neural network based on the exit determination.

11. The semiconductor apparatus of claim 10, wherein the logic coupled to the one or more substrates is to clear a loop iteration counter associated with the second subset of layers if the output satisfies the one or more exit criteria.

12. The semiconductor apparatus of claim 11, wherein the logic coupled to the one or more substrates is to set the loop iteration counter if the output does not satisfy the one or more exit criteria.

13. The semiconductor apparatus of claim 10, wherein the operation is a speculative operation.

14. The semiconductor apparatus of claim 10, wherein the inference workload is to include a plurality of batches and the logic coupled to the one or more substrates is to mask one or more of the plurality of batches from processing in the second subset of layers.

15. The semiconductor apparatus of claim 10, wherein the one or more exit criteria is to include a ratio of data is relatively far away from a decision boundary to data that is relatively close to the decision boundary.

16. The semiconductor apparatus of claim 10, wherein the logic coupled to the one or more substrates is to execute the first subset of layers on a common execution unit.

17. The semiconductor apparatus of claim 10, wherein the logic coupled to the one or more substrates includes transistor channel regions that are positioned within the one or more substrates.

18. A method comprising:
processing an inference workload in a first subset of layers of a neural network that prevents data dependent branch operations;
conducting an exit determination as to whether an output of the first subset of layers satisfies one or more exit criteria;
initiating an operation to process the output in a second subset of layers of the neural network while the exit determination is pending; and
selectively bypassing processing of the output in a second subset of layers of the neural network based on the exit determination.

19. The method of claim 18, wherein selectively bypassing the processing of the output in the second subset of layers includes clearing a loop iteration counter associated with the second subset of layers if the output satisfies the one or more exit criteria.

20. The method of claim 18, wherein selectively bypassing the processing of the output in the second subset of layers includes setting the loop iteration counter if the output does not satisfy the one or more exit criteria.

21. The method of claim 18, wherein the operation is a speculative operation.

22. The method of claim 18, wherein the inference workload includes a plurality of batches and the method further comprises selectively bypassing processing of the output in the second subset of layers includes masking one or more of the plurality of batches from processing in the second subset of layers.

23. The method of claim 18, wherein the one or more exit criteria includes a ratio of data that is relatively far away from a decision boundary to data that is relatively close to the decision boundary.

24. The method of claim 18, further including executing the first subset of layers on a common execution unit.

* * * * *